Jan. 7, 1969 W. NOLDE 3,421,103

SEMICONDUCTOR INTEGRATED TRANSISTOR CASCADE FOR AMPLIFYING PURPOSES

Filed Aug. 2, 1966

United States Patent Office 3,421,103

Patented Jan. 7, 1969

3,421,103
SEMICONDUCTOR INTEGRATED TRANSISTOR CASCADE FOR AMPLIFYING PURPOSES

Wolfgang Nolde, Palo Alto, Calif., assignor to Siemens Aktiengesellschaft, Munich, Germany, a corporation of Germany Filed Aug. 2, 1966, Ser. No. 569,694
Claims priority, application Germany, Aug. 4, 1965, S 98,622
U.S. Cl. 330—28 4 Claims
Int. Cl. H03f *1/34*

ABSTRACT OF THE DISCLOSURE

In a transistor cascade amplifier integrated circuit, a metal wire is electrically connected between the emitter of one of the transistors and a metal base plate. A feedback resistor is electrically connected between the emitter and a feed-through pin of the base plate. The feed-through pin insulated from the base plate is electrically connected to the base plate via a metal wire having an electrical resistance which is such that the total feedback resistance has a desired magnitude.

My invention relates to multi-stage transistor amplifiers and in a more particular aspect to a semiconductor integrated circuit constituting a cascade connection of amplifying transistors.

Cascade circuits of transistors serve to provide for high amplifying gain. With such multi-stage networks, however, the inevitable differences in transistor parameters cause fluctuations in amplifying performance. This is particularly critical if the cascade is constituted as an integrated circuit, since then the individual transistors of the multi-stage amplifier cannot be individually selected or matched for the desired coaction.

To reduce the effect of such stray in parameter values, a negative feedback may be employed. The feedback may be designed as a current-voltage negative feedback connection between the emitters of the transistors which meet the phase condition for negative feedback operation.

It is an object of my invention to devise a semiconductor integrated transistor cascade in which such a negative feedback is realized in a simple and reliable manner, thus minimizing or virtually eliminating the detrimental effects of parameter stray.

Another object of the invention is to provide an integrated multi-stage transistor amplifier whose electrical parameters are distinguished by a particularly high degree of stability.

Still another object of the invention is to afford the production of semiconductor integrated transistor amplifiers of the cascade or multi-stage type in which the electrical differences between different specimens of a manufacturing series remain within particularly narrow tolerances.

It is also an object of my invention to improve integrated multi-stage transistor amplifiers of the encapsulated type in such a manner that one and the same encapculated amplifier can be used selectively for providing different values of amplifying gain or for adapting it to respectively different load resistances.

To achieve these objects and in accordance with a feature of my invention, a multi-stage transistor amplifier is formed as a semiconductor integrated circuit which comprises a number of transistors in electrical cascade connection and is equipped with encapsulating means having one or more feed-through leads, and I provide the cascade connection of the transistor integrated circuit with a negative feedback by connecting resistance means between the feed-through lead of the encapsulation and at least one of the emitters of the transistor cascade. It is preferable to compose the cascade of an odd number of transistors, although the invention is also applicable to advantage with an even number of cascade transistors.

Figure 1:
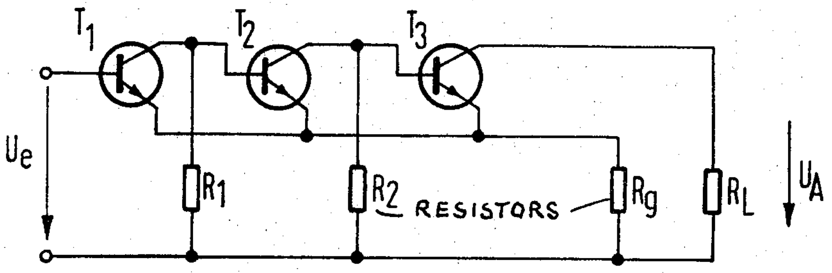
Figure 2:
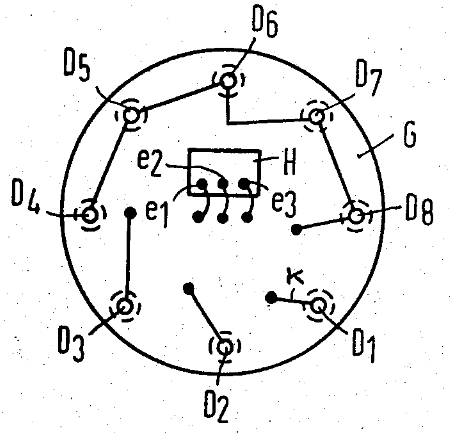

The invention will be further described with reference to an embodiment illustrated by way of example in the accompanying drawing, in which:

FIG. 1 is an electrical circuit diagram of a transistor amplifier according to the invention; and FIG. 2 shows a view onto the header or base plate of the appertaining encapsulation.

The transistor cascade according to FIG. 1 comprises three amplifying stages which are constituted by a semiconductor integrated circuit and consequently preferably combined within a single semiconductor substrate, for example of silicon. The cascade is formed by transistors $T_1$, $T_2$ and $T_3$ whose respective emitters are directly connected with each other. Resistors $R_1$ and $R_2$ are provided for supplying direct current. Their magnitudes need not be taken into account as far as the computation of amplifying gain is concerned. Connected in the common emitter lead of the cascade is a feedback resistor $R_g$ whose resistance value is to be chosen in accordance with the desired amplifying gain and in dependence upon the resistance of the load $R_L$ connected in the collector output circuit of the cascade. The amplifying gain $V_U$ is approximately determined by the following equation:

$$V_U=\frac{-R_L}{\frac{R_e}{\beta^3}+R_g}$$

In this equation, $R_e$ denotes the input resistance of transistor $T_1$, and $\beta$ denotes the current amplifying gain which is assumed to be the same for each of the transistors $T_1$, $T_2$ and $T_3$.

If the factor $R_e \div \beta^3$ in the denominator is made sufficiently small relative to $R_g$, the gain $V_U$ becomes independent of the transistor parameters.

Referring to FIG. 2, it should be understood that the transistors $T_1$, $T_2$ and $T_3$ of the cascade are all combined within a semiconductor substrate H formed by a wafer of silicon. The emitters of the respective transistors are schematically indicated at $e_1$, $e_2$, $e_3$. The wafer is alloy-bonded to a metallic base plate or header G of the conventional encapsulation. The header plate G is preferably coated with gold, also in the conventional manner. The emitters, $e_1$, $e_2$, $e_3$ are connected by respective wires of gold with the plate G. An insulated and sealed feed-through pin $D_1$ with which the header plate G is provided, serves as a common connection for the three emitters. For this purpose, the feed-through pin $D_1$ is electrically connected with the header plate G by means of a contact wire K which is given such a length that its resistance plus the resistances of the feed-through wire and of the plate G with the appertaining contact resistances result in the desired total negative feedback resistance ($R_g$).

The device described has the following advantages:

(1) The resistance value is independent of the position which the semiconductor wafer H occupies on the header plate G.

(2) All of the contact resistances occurring within the device are formed between two bodies of gold and are therefore particularly stable electrically.

Another essential advantage resides in the fact that the resistance of the wire used for contacting the transistor emitters can be so dimensioned that it operates, conjointly with the semiconductor integrated circuit, as a negative feedback to impose a maximum limit, together with the load resistance, upon the attainable voltage amplification. Consequently, it is only necessary to fix a lower limit for the current amplification $\beta$ for maintaining the specimen stray of the amplifying gain within close tolerances.

According to another feature of my invention, and as also shown in FIG. 2, several emitter leads of respectively different lengths may be provided in one and the same device in order to afford adapting it for respectively different amplification gain values and/or different load resistance values. Thus, the device shown in FIG. 2 is provided with additional feed-through pins $D_2$ to $D_8$ which are connected, either individually or as a series, with the header plate G. By then employing selectively one or the other of the available feed-through pins, the effective negative feedback resistance can be varied accordingly.

Described presently is a numerical example for a cascade connection according to FIG. 1. The input resistance of transistor $D_1$ was approximately 3K ohm. The load resistance $R_L$ was about 195 ohm. Required was a voltage amplification of 1780 times the input voltage, corresponding to 65 db. Fom these data, allowing for the usual resistance tolerances (±20%), there results a value of about 80M ohm for the feedback resistance $R_g$. According to FIG. 2, this resistance is composed of the following components: (1) Contact resistances of 15M ohm each, (2) the resistance of the feed-through pin of 7 mm. length amounting to about 15M ohm, (3) the resistance of the contacting wire K whose length is to be chosen in accordance with the remaining 35M ohm. With these parameter values, a fluctuation of voltage amplification in the narrow range of 63 to 67 db was observed at a stray in current amplification over the range of 50 to 500.

I claim:

1. A transistor cascade amplifier integrated circuit, the transistor of said circuit having emitters, said circuit comprising

- a metal base plate having a feed-through pin insulated from said base plate;
- a feedback resistor electrically connected between one of the emitters of said transistors and said feed-through pin; and
- a metal wire electrically connected between said one of said emitters and said base plate, said feed-through pin being electrically connected to said base plate via a metal wire having an electrical resistance which is such that the total feedback resistance has a desired magnitude.

2. A transistor cascade amplifier integrated circuit as claimed in claim 1, wherein the emitter of each of said transistors is electrically connected to said base plate via a corresponding one of a pluality of metal wires.

3. A transistor cascade amplifier integrated circuit as claimed in claim 1, wherein said metal base plate has a plurality of feed-through pins insulated from said base plate, the emitter of each of said transistors is electrically connected to said base plate via a metal wire and each of said feed-through pins is electrically connected to said base plate via a corresponding one of a plurality of metal wires, each of said metal wires having a corresponding electical resistance which is such that the total feedback resistance varies in magnitude in accordance with the connection in circuit of different ones of said feed-through pins.

4. A transistor cascade amplifier integrated circuit as claimed in claim 3, wherein said feed-through pins are electrically connected to each other.

References Cited

UNITED STATES PATENTS

| | | | |
|---|---|---|---|
| 3,323,071 | 5/1967 | Mitchell | 330—38 |
| 3,349,300 | 10/1967 | Koepp et al. | 317—235 |

OTHER REFERENCES

Custom Microcircuit Design Handbook, Fairchild Semiconductor, pp. 33, 34, copyright 1962.

Needham: "The Transistor Type Integrated Circuit Packages," SCP and Solid State Technology, May 1965, pp. 27–29.

Uzunoglu: "Feedback: Perils and Potentials in Designing Integrated Circuits," Electronics, May 31, 1965, pp. 67, 68.

Wood: "Gain Controlled Band Pass Amplifiers," Electronic Engineering, April 1964, pp. 234–235.

JOHN KOMINSKI, *Primary Examiner.*

JAMES B. MULLINS, *Assistant Examiner.*

U.S. Cl. X.R.

330—38, 19, 88